United States Patent [19]
Hwang et al.

[11] Patent Number: 5,604,464
[45] Date of Patent: Feb. 18, 1997

[54] CASCODE OPERATIONAL AMPLIFIER WITH MULTIPLE INPUT STAGE

[75] Inventors: Chien-Meen Hwang, Stanford; Eugen Gershon, San Jose, both of Calif.

[73] Assignee: Advanced Micro Devices, Inc., Sunnyvale, Calif.

[21] Appl. No.: 499,315

[22] Filed: Jul. 7, 1995

[51] Int. Cl.$^6$ ............................................. H03F 3/45
[52] U.S. Cl. .......................... 330/253; 330/258; 330/311
[58] Field of Search ................................. 330/252, 253, 330/258, 311

[56] References Cited

U.S. PATENT DOCUMENTS

| | | |
|---|---|---|
| 3,870,966 | 3/1975 | Dingwall . |
| 4,656,437 | 4/1987 | Saari . |
| 5,117,199 | 5/1992 | Wang et al. ........................... 330/252 |

FOREIGN PATENT DOCUMENTS

| | | |
|---|---|---|
| 0108428 | 5/1984 | European Pat. Off. . |
| 0159757 | 10/1985 | European Pat. Off. . |

OTHER PUBLICATIONS

De La Plaza et al, "Power–Supply Rejection in Differential Switched–Capacitor Filters", *IEEE Journal of Solid–State Circuits*, vol. SC–19, No. 6, Dec. 1984, pp. 912–918.

Proceedings of the Custom Integrated Circuits Conference, Boston, May 13–16, 1990. No Conf. 12, 13–16 May 1990, Institute of Electrical and Electronics Engineers, pp. 1211–1215, XP 000167685; Nicholas van Bavel, et al. "ISDN U Transceiver Analog Front–End".

Proceedings of the Custom Integrated Circuits Conference, Boston, May 13–16, 1990. No. Conf. 12, 13–16 May 1990, Institute of Electrical and Electronics Engineers, pp. 1211–1215, XP 000167683 K. Nagaraj "CMOS Amplifiers Incorporating a Novel Slew Rate Enhancement Technique".

*Primary Examiner*—James B. Mullins
*Attorney, Agent, or Firm*—Douglas A. Chaikin

[57] ABSTRACT

Disclosed herein is a cascode operational amplifier design with multiple input stages, and methods of operating the same, resulting in enhanced output gain and unity gain bandwidth operational amplifiers. The cascode operational amplifier comprises a differential input block which receives a differential input having a first differential input stage and a second differential input stage. A cascode block is coupled to the differential input block and provides a differential output for the operational amplifier. A common mode feedback block coupled to the second differential input stage of the differential input block and the differential output of the cascode block stabilizes a DC output level for the differential output. A load block is coupled to the differential output of the cascode block and applies a resistive load to the differential output in response to a differential input signal applied to the differential input block.

14 Claims, 6 Drawing Sheets

(PREVIOUS ART)

(PREVIOUS ART)

CASCODE OPERATIONAL AMPLIFIER WITH MULTIPLE INPUT STAGE

BACKGROUND OF THE INVENTION

1. Field of the Invention

The present invention relates to operational amplifier technology and more particularly to an improved operational amplifier with improved gain and bandwidth.

2. Description of Previous Art

As very large scale integration (VLSI) circuits with more and more functions and higher operating speeds are being developed for integrated system applications, the demand for higher performance operational amplifiers for integrated system applications steadily grows. Functions that required three or four chips in the past are now being performed by a single VLSI circuit. The higher operating speeds provide faster circuits and quicker responses from electronic devices. Currently, an amplifier design well suited for integrated system applications is a folded cascode complimentary metal oxide silicon (CMOS) operational amplifier (op amp) design. The folded cascode CMOS op amp can be implemented readily on a VLSI circuit wafer and incorporated with other VLSI circuits. Increasing the gain of op amps permits signals within the VLSI circuits to operate at lower levels which reduces noise and power consumption of VLSI circuits. Increasing the bandwidth capabilities permit the op amp to operate at higher frequencies.

It is desirable to provide an op amp design well suited for VLSI circuits, and a method of operating the same which provide increased gain and bandwidth without suffering from increased size and power dissipation penalties of existing designs.

SUMMARY OF THE INVENTION

An aspect of this invention is to provide a high performance op amp with high gain and increased bandwidth without substantially increasing the power consumption.

Another aspect of this invention is to provide a high performance op amp suitable for VLSI circuit applications.

Another aspect of this invention is to provide a high performance op amp that can be easily incorporated into existing lower performance op amp designs.

In accordance with the above aspects and those that will be mentioned and will become apparent below, the cascode operational amplifier in accordance with this invention comprises:

a differential input block which receives a differential input having a first differential input stage and a second differential input stage, a cascode block coupled to the differential input block which reduces Miller effect, a common mode feedback block coupled to the second differential input stage of the differential input block and the differential output of the cascode block which stabilizes a direct current (DC) output level for the differential output, and a load block coupled to the differential output of the cascode block which applies a resistive load to the differential output in response to a differential input signal applied to the differential input block.

In a preferred embodiment, the first differential input stage includes a first current source which regulates current through the first differential input stage. The second differential input stage includes a second current source which regulates current through the second differential input stage. The second current source provides proper biasing of the second differential input stage and supplies current to the first differential input stage and the second differential input stage.

The preferred embodiment additionally provides that the differential input block includes a first level shift circuit coupled between the first differential input stage and the second differential stage for shifting an input level to the second differential stage. The first level shift circuit may be constructed using source follower circuits. The first level shift circuit is not needed if the first differential input stage and the second differential input stage are adjusted to the same level.

Another preferred embodiment provides that the load block includes a third differential input stage coupled to the first differential input stage and the second differential input stage which receives the differential input. The third differential input stage additionally increases the gm of the op amp and additionally increases the output gain and the unity gain bandwidth of the op amp. The third differential input stage includes a third current source which regulates current through the third differential input stage. A second level shift circuit coupled between the first differential input stage and the third differential input stage shifts an input level to the third differential stage. Similar to the first level shift circuit, the second level shift circuit may be constructed using source follower circuits. The second level shift circuit is not needed if the first differential input stage and the third differential input stage are adjusted to the same level.

It is an advantage of this invention to increase the $g_m$ of the op amp by increasing the number of differential input stages. Increasing the $g_m$ of the op amp provides improved gain and unity gain bandwidth. The $g_m$ of the improved op amp is increased without substantial increases in power consumption and wafer usage. It should be noted that, circuit modifications between the existing op amp design and the improved op amp design are minor. The improved op amp is based still on CMOS technology which is well suited for VLSI circuits that primarily rely on CMOS circuits. Because the power dissipation and the overall circuit implementation of the improved op amp remain virtually unchanged, existing designs that use the single differential input stage op amp design can incorporate readily the improved multiple differential input stage op amp design with minor modifications to the existing designs.

Other aspects and advantages of the present invention can be seen upon review of the figures, the detailed description, and the claims which follow.

DETAILED DESCRIPTION OF THE INVENTION

Figure 1:
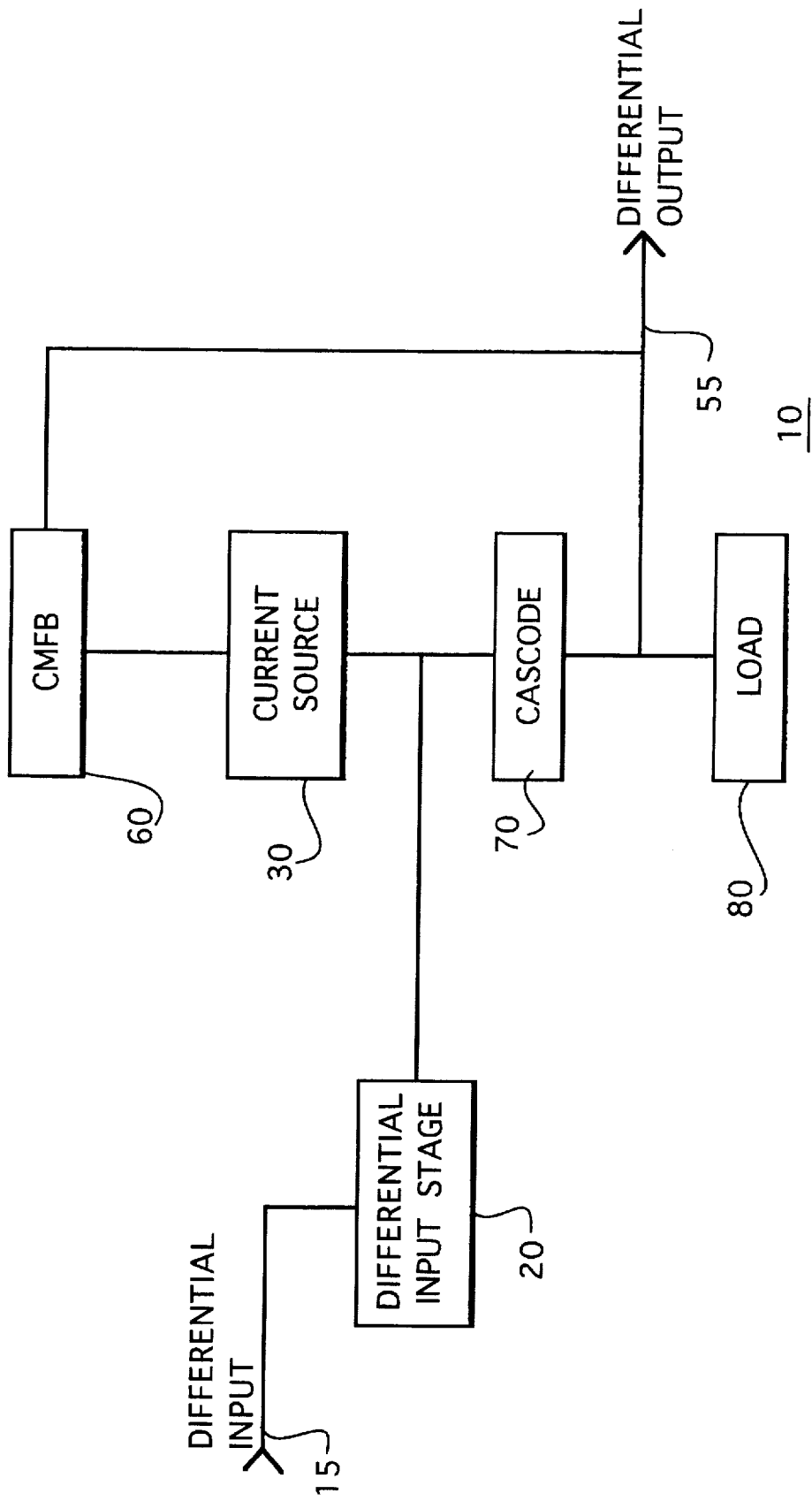
FIG. 1 is a block diagram of a previous art cascode CMOS operational amplifier.

A detailed description of preferred embodiments of the present invention is provided with respect to the drawings. FIG. 1 is a block diagram of a folded cascode CMOS op amp 10 known in the previous art. Op amp 10 includes a differential input 15 and a differential output 55. A differential input stage 20 is coupled to a current source block 30 and a cascode block 70. The input to cascode block 70 comes from the output of the differential input stage 20. The current source block 30 provides current to the differential input stage 20, the cascode block 70, and the load block 80. The differential output 55 is coupled to the cascode block 70, a load block 80, and a common mode feedback block (CMFB) 60. The CMFB block 60 receives the output from the differential output 55 and stabilizes the direct current (DC) output level of an output signal. The cascode block 70 and the load block 80 provide high output impedance for op amp 10.

Figure 2:
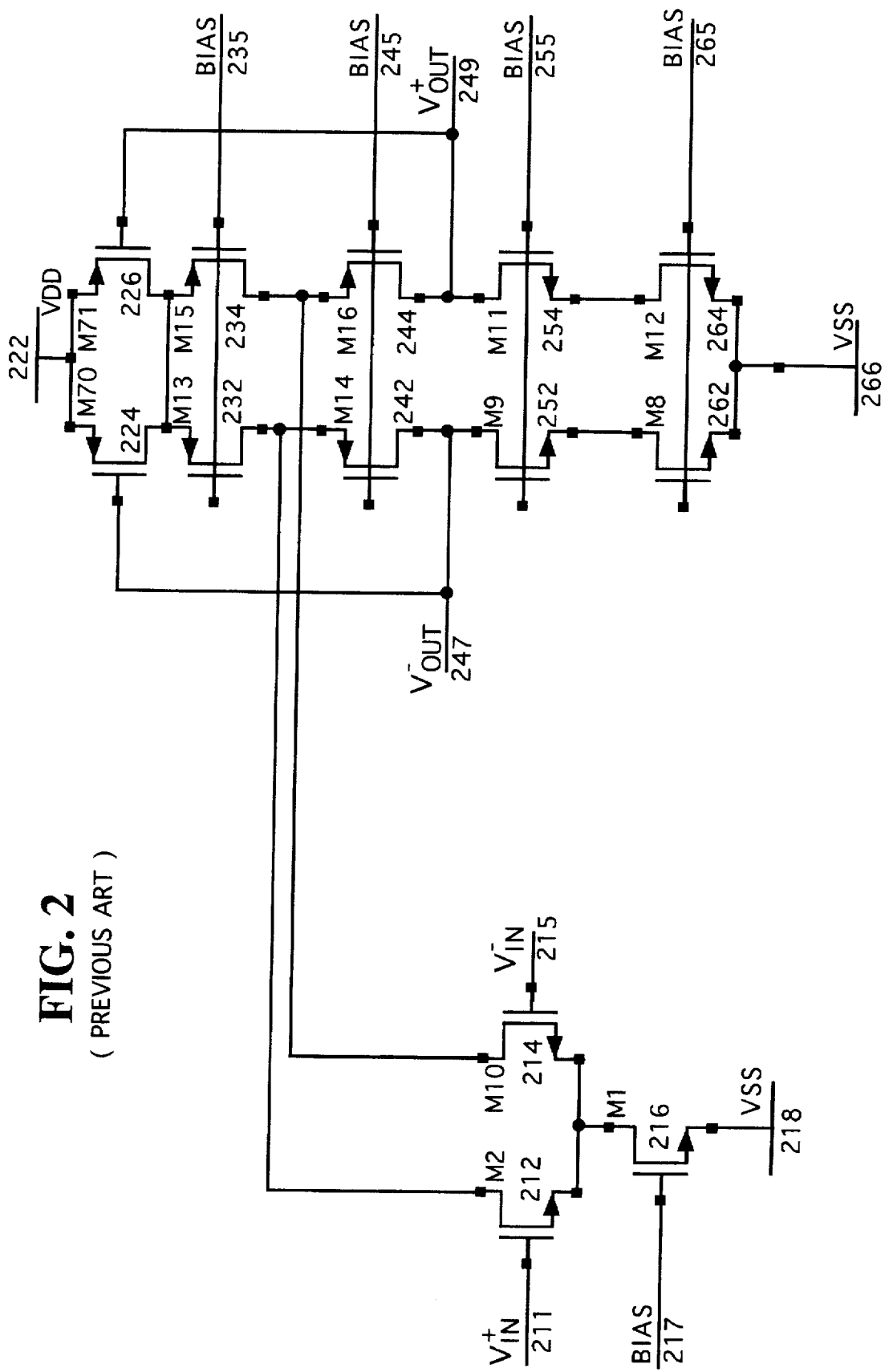
FIG. 2 is a schematic diagram of the previous art cascode CMOS operational amplifier of FIG. 1.

FIG. 2 is a schematic diagram of the folded cascode CMOS op amp 10 of FIG. 1. The circuit components for each block of op amp 10 shown in FIG. 1 are depicted in the schematic diagram. The differential input stage 20 includes n-channel devices 212, 214, and 216. A positive input 211 and a lowest potential input 215 provides inputs to the n-channel devices 212 and 214, respectively. N-channel device 216 controls current through n-channel devices 212 and 214 to the lowest potential, $V_{ss}$ 218. A bias voltage 217 biases the n-channel device 216.

The current source block 30 includes p-channel devices 232 and 234 which provide current to the n-channel devices 212 and 214 of the differential input stage 20 and p-channel devices 242 and 244 of the cascode block 30. Bias voltage 235 biases the p-channel devices 232 and 234 of current source 30.

P-channel devices 242 and 244 of the cascode block 30 provide a lowest potential output 247 and a positive output 249, respectively.

CMFB block 60 includes p-channel devices 224 and 226 which are coupled to a power source that supplies the highest potential $V_{dd}$ 222. The lowest potential output 247 and positive output 249 of op amp 10 are coupled to the p-channel devices 224 and 226, respectively. The CMFB block 60 stabilizes the DC output level of the differential outputs 247 and 249.

Load block 80 includes n-channel devices 252, 254, 262, and 264. N-channel devices 252 and 254 are coupled to the lowest potential output 247 and the positive output 249, respectively. Bias voltage 255 controls biasing of n-channel devices 252 and 254. N-channel devices 262 and 264 are coupled to the n-channel devices 252 and 254, respectively. A lowest potential reference, $V_{ss}$ 266 is coupled to the n-channel devices 262 and 264. The Bias voltage 265 controls biasing of the n-channel devices 262 and 264.

As is known, the DC gain of op amp 10 is $g_m$ 212 $R_d$ where $g_m$ is the transconductance of the differential input stage 20 and $R_d$ is the equivalent output resistance of op amp 10. The unity gain bandwidth of op amp 10 is $g_m$ 212/$C_L$ where $C_L$ is the load capacitance of the output. The $g_m$ of an op amp is determined by the ratio of the change in the total output current to the change in input voltage. The $g_m$ for metal oxide silicon (MOS) devices is equal to the square root of $(2\mu C_{ox} W/L)$; $\mu$ is the mobility; $C_{ox}$ is the oxide capacitance; W is the width of the device; I is the current of the device; and L is the length of the device. (See "Analysis and Design of Analog Integrated Circuits" Third Edition, Paul R. Gray and Robert G. Meyer.)

The DC gain and the unity gain bandwidth of an op amp is proportional to $g_m$. Increasing $g_m$ increases the gain and the bandwidth of the op amp. Given that $\mu$, $C_{ox}$, and the ratio of W/L are constants, the current I is the only variable that can be changed readily to increase the $g_m$. However, $g_m$ is proportional to the square root of the current I. Thus, in order to double the gain and the bandwidth, the current I must be increased by a factor of four. Such a current I increase greatly increases the power consumption of the amplifier. Consequently, increasing $g_m$ by increasing the current requires larger wafer space on the integrated circuit for heat dissipation and larger power supplies for supplying the additional current.

Figure 3:
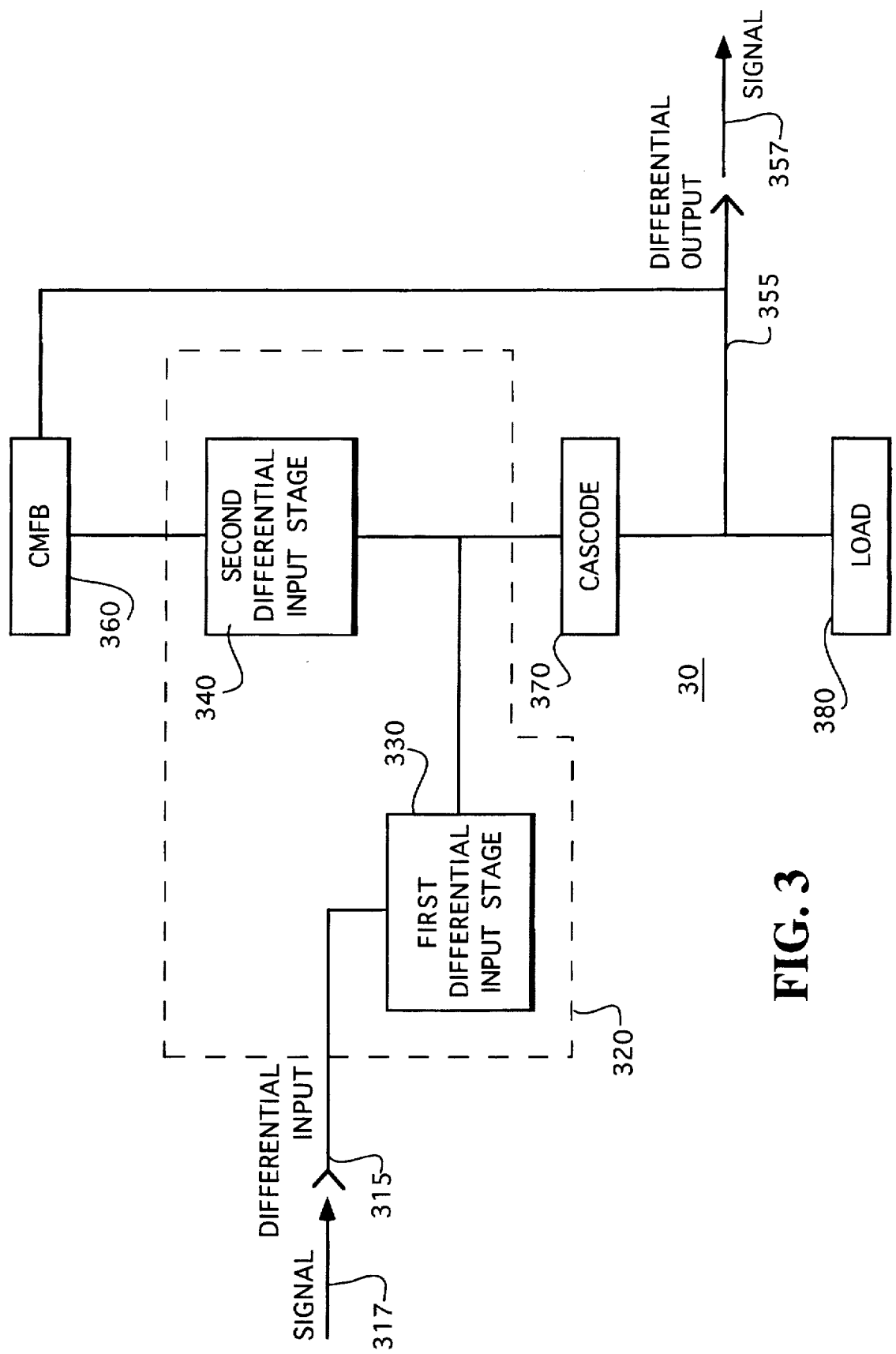
FIG. 3 is a block diagram of a cascode CMOS operational amplifier in accordance with the present invention.

FIG. 3 provides an overview of the layout of a cascode operational amplifier (op amp) according to the present invention shown generally by the numeral 30. The op amp 30 has a differential input 315 for receiving a differential signal 317 and a differential output 355 for providing an amplified differential signal 357. Differential input block 320 receives the differential signal 317 at the differential input 315. A differential input block 320 includes a first differential input stage 330 and a second differential input stage 340. The differential input 315 is coupled to the first differential input stage 330 and the second differential input stage 340. The differential input signal 317 is applied to the first differential input stage 330 and the second differential input stage 340.

A cascode block 370 is coupled to the first differential input stage 330 and the second differential input stage 340. The cascode block 370 provides the differential output 355. The load block 380 is coupled to cascode block 370 and the differential output 355. The cascode block 370 and load block 380 increase the output resistance of op amp 30.

A common mode feedback (CMFB) block 360 is coupled to the second differential input stage 340 and the differential output 355. The CMFB 360 receives the amplified differential signal 357 from the differential output 355 and stabilizes the direct current (DC) output level of the amplified differential signal 357.

Figure 4:
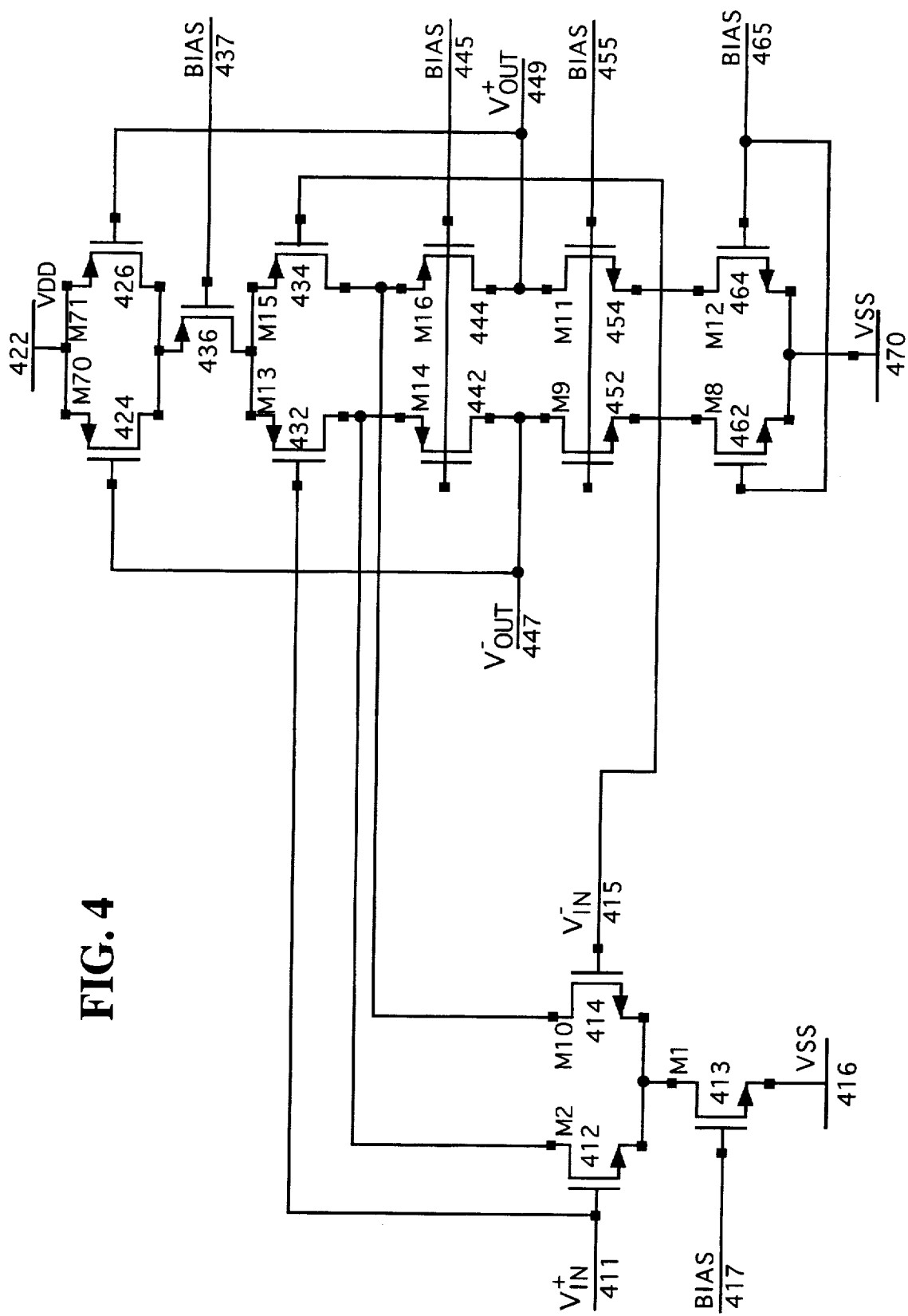
FIG. 4 is a schematic diagram of a cascode CMOS operational amplifier in accordance with one embodiment of the present invention.

With particular reference to FIG. 4, there are shown the components for each block of the op amp 30. The components for the op amp 30 include a first differential input stage 330 having a plurality of n-channel devices 412, 413, and 414 and a second differential input stage 340 includes p-channel devices 432, 434, and 436.

The gate of n-channel device 412 provides a positive input terminal 411 and the gate of n-channel device 414 provides a lowest potential input terminal 415. The positive input terminal 411 and the lowest potential input terminal 415 correspond to the differential input 315 of FIG. 3. The differential input signal 317 is applied to the positive input terminal 411 and the lowest potential input terminal 415.

The N-channel devices 412 and 414 comprise a first differential input pair, and n-channel device 413 functions as a current source for the first differential input pair. The sources of n-channel devices 412 and 414 are coupled to the drain of the n-channel device 413. The source of the n-channel device 413 is coupled to a lowest potential reference, $V_{ss}$ 416, and the gate of the n-channel device 413 is coupled to a Bias voltage 417. The Bias voltage 417 controls the drain current through the n-channel device 412 and n-channel device 414 of the first differential input stage 330.

The second differential input stage 340 provides drain current to the n-channel devices 412 and 414 of the first differential input stage 330. The P-channel devices 432 and 434 comprise a second differential input pair. The P-channel device 436 functions as a current source for the second differential pair. The drain of the n-channel device 412 is coupled to the drain of a p-channel device 432, and the drain of the n-channel device 414 is coupled to the drain of a p-channel device 434. The gate of the p-channel device 432 is coupled to the positive input terminal 411, and the gate of p-channel device 434 is coupled to the lowest potential input terminal 415. The sources of the p-channel devices 432 and 434 are coupled to the drain of a p-channel device 436. The gate of p-channel device 436 is coupled to a Bias voltage 437. The bias voltage 437 controls drain current through the p-channel devices 432 and 434 of the second differential input stage 340.

The CMFB block 360 includes p-channel devices 424 and 426. The drains of p-channel device 424 and 426 are coupled to the source of the p-channel device 436. The sources of p-channel device 424 and 426 are coupled to an input power source, Vdd 422. The gate of the p-channel device 424 is coupled to a lowest potential output 447, and the gate of the p-channel device 426 is coupled to a positive output 449. The CMFB block 360 receives the lowest potential output 447 and the positive output 449 to stabilize the DC output level from the outputs 447 and 449.

The cascode block 370 includes a p-channel device 442 and a p-channel device 444. The source of the p-channel device 442 is coupled to the drain of the p-channel device 432, and the source of the p-channel device 444 is coupled to the drain of the p-channel device 434. The p-channel devices 432, 434, and 436 of the second differential input stage 340 provide input current to the p-channel devices 442 and 444 of the cascode block 355. The drain of p-channel device 442 is coupled to the lowest potential output 447, and the drain of p-channel device 444 is coupled to the positive output 449. The gates of p-channel devices 442 and 444 are coupled to a bias voltage 445. The bias voltage 445 sets the operating point of the p-channel devices 442 and 444.

The load block 380 includes n-channel devices 452, 454, 462, and 464. The drain of n-channel device 452 is coupled to the lowest potential output 447, and the drain of n-channel device 454 is coupled to the positive output 449. The source of n-channel device 452 is coupled to the drain of the n-channel device 462, and the source of the n- channel device 454 is coupled to the drain of the n-channel device 464. The sources of n-channel device 462 and 464 are coupled to a lowest potential reference potential, $V_{ss}$ 470. The gates of the n-channel devices 452 and 454 are coupled to bias voltage 455, and the gates of n- channel devices 462 and 464 are coupled to bias voltage 465. Biases 455 and 465 set the operating point of n-channel load devices 452, 454, 462, and 464 for providing a resistive load at the lowest potential output 447 and positive output 449. The n-channel devices of the load block 380 provide the output resistance of the op amp 30.

The DC gain of a folded cascode CMOS op amp is the product of $g_m$ and $R_d$ where $g_m$ being the transconductance and $R_d$ the equivalent output resistance of the op amp. The unity gain bandwidth of the amplifier, $\omega_o$, equals $g_m/C_L$ where $C_L$ is the load capacitance at the output. Thus, by increasing the input transconductance, $g_m$, of an op amp, the DC gain and the unity gain bandwidth of the op amp are increased.

The ratio of the change in the total output current to the change in input voltage determines the $g_m$. The $g_m$ of the op amp 30 having multiple differential input stages is the sum of the $g_m$'s from each differential input stage. Referring to FIG. 4, the second differential input stage 340 supplies current for the first differential input stage 330, the cascode block 370, and the load block 380. Thus, the drain of p-channel device 432 supplies current to the drain of n-channel device 412 and the source of the p- channel device 442. Similarly, the drain of p-channel device 434 supplies current to the drain of n-channel device 414 and the source of p-channel device 444. An input signal $V_{in}$ applied to the gate of n-channel device 412 provides a current in device 412. The current in device 412 is offset by the change in current $dI_{in}=g_m$, 412 $V_{in}$. The current in p-channel device 432 which supplies current to n-channel device 412 and p-channel device 442 is the total current and is offset also by the change in current $dI_{tot}=g_m$432 $V_{in}$. The total current change into the load of op amp 30 is equal to the sum of the change in current $dI_{in}+dI_{tot}$. Substituting $g_m$ $V_{in}$ for dI results in the total output current change to the load being equal to $g_m$ 412 $V_{in}+g_m$ 432 $V_{in}$. Factoring out $V_{in}$ results in $g_m=g_m$ 412 $+g_m$ 432. Thus, the $g_m$ of the op amp 30 is the sum of the first differential input stage 330 and the second differential the input stage 340.

The $g_m$ is defined as the square root of $(2\mu C_{ox} WI/L)$; $\mu$ is the mobility; $C_{ox}$ is the oxide capacitance; W is the width of the device; I is the current of the device; and L is the length of the device. The $g_m$ for op amp 30 is the square root of $(2\mu C_{ox} W412 \text{Iinput}/L412)$+the square root of $2\mu C_{ox} W432 \text{Itotal}/L432$). The $g_m$ for a single differential input stage op amp is just the first term of the $g_m$ tier the op amp 30. Designing the ratio of W432/L432 no less than the ratio of W412/L412 results in a $g_m$ that is theoretically more than twice the $g_m$ of a single differential input stage op amp. In practice, the ratio of W432/L432 is typically more than W412/L412 because the current through the p-channel device 432 is greater than the current through the n-channel device 412. Given that gm is directly proportional to the gain and the bandwidth the of op amp 30, both the output gain and the unity gain bandwidth are increased without increasing the current consumption.

Figure 5:
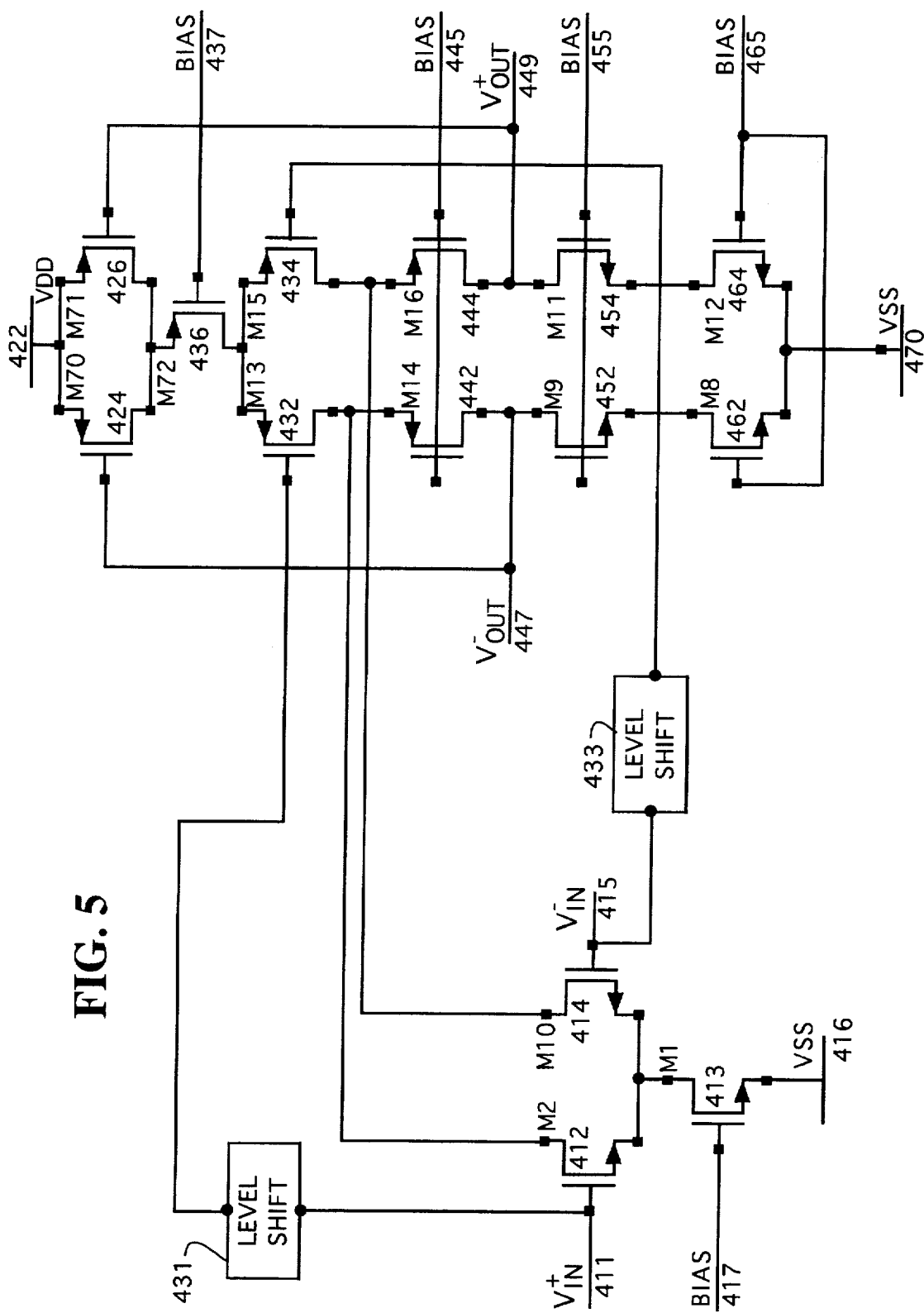
FIG. 5 is a schematic diagram of a cascode CMOS operational amplifier incorporating an input level shift for the second differential input stage.

FIG. 5 provides a schematic diagram of the op amp 30 with a level shift block 431 and a level shift block 433. The level shift block 431 is coupled between the gate of the n-channel device 412 and the gate of the p-channel device 432. The level shift block 433 is coupled between the gate of the n-channel device 414 and the gate of p-channel device 434. The level shift blocks 431 and 433 include circuitry which corrects the DC level of the inputs to the p-channel device 432 and 434. The level shift blocks 431 and 433 are not needed when the first differential input stage 330 and the second differential input stage 340 are adjusted to the same level. Source followers provide circuits which shift the input levels to the inputs for the p-channel devices 432 and 434. The current consumption of the source followers are small compared to the current consumption of the op amp 30. Even with the additional source followers, the op amp 30 dissipates slightly more power but develops substantially more gain and increased bandwidth.

Figure 6:
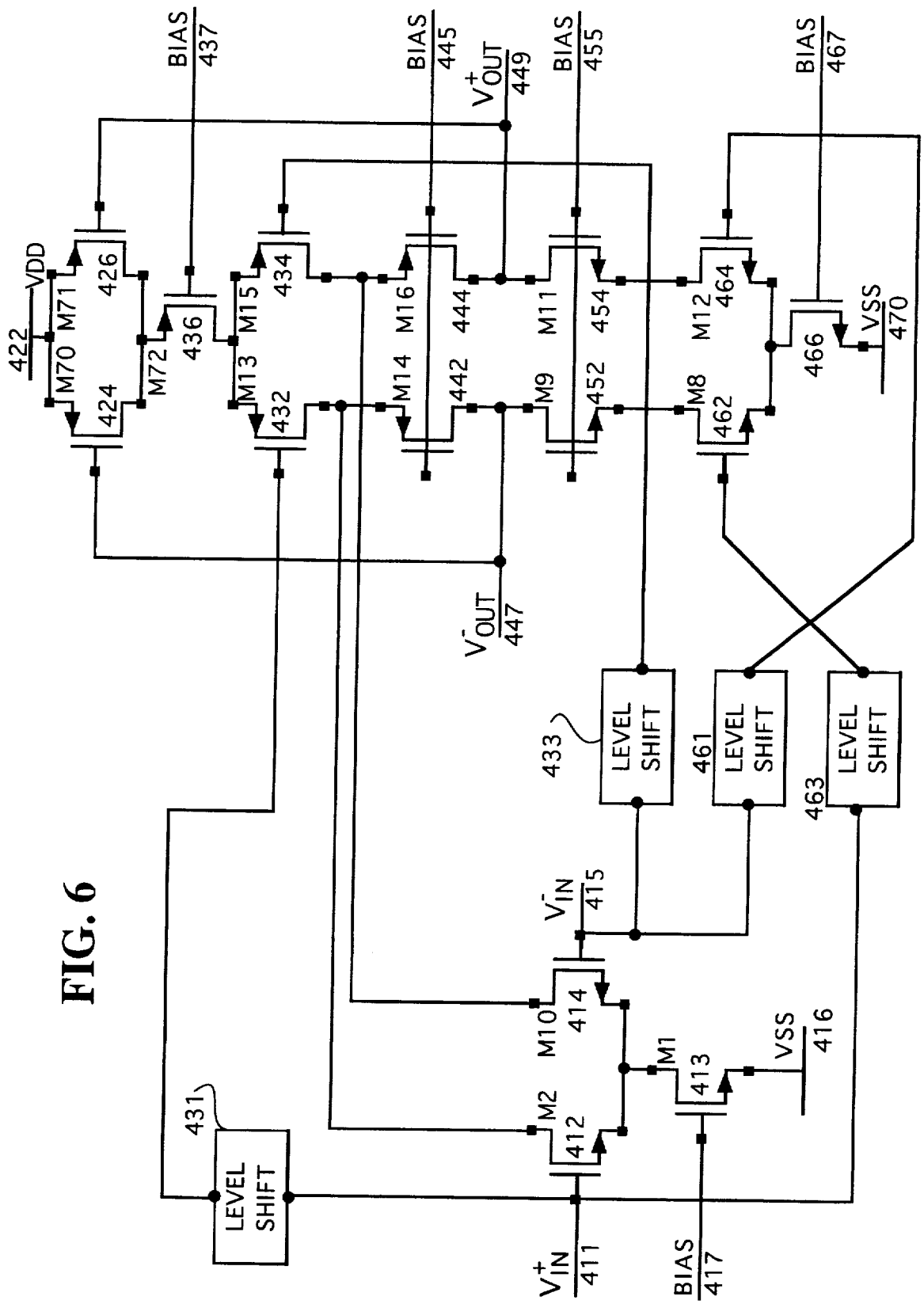
FIG. 6 is a schematic diagram of a cascode CMOS operational amplifier according to a second embodiment of the present invention having a third differential input stage.

With particular reference to FIG. 6, there is shown an op amp 50 having a third differential input stage. N-channel devices 462 and 464 provide the input devices for a third differential input pair. A level shifter 463 is coupled between the gate of the n-channel device 462 and the gate of n-channel device 412. A level shift block 461 is coupled between the gate of the n-channel device 464 and the gate of the n-channel device 414. The level shift blocks 461 and 463 provide similar functions as the level shift blocks 431 and 433. The level shift blocks 461 and 463 shift the input signal to correct the DC level of the input signal to the gate of the n-channel devices 464 and 462, respectively. Similar to level shift blocks 431 and 433, a source follower is an example of a circuit that can provide the circuitry for the level shift blocks 461 and 463. The source follower consumes little current compared to the current consumption of the op amp 50. Thus, power dissipation of the op amp 50 having the additional source follower circuits is increased slightly. The level shift blocks 431 and 433 are not needed when the third differential input devices 462 and 464 are adjusted to the same input level as the first differential input devices 412 and 414.

The analysis of $g_m$ for the op amp 50 having three differential input stages is similar to the analysis of $g_m$ having two differential input stages as set forth above. Thus, the advantages of an op amp having two differential input stages also applies to three differential stages. The $g_m$ for each differential input stage contributes its own transconductance. Summing the $g_m$'s for each differential input stage results in the $g_m$ for the op amp 50. The current draw of the op amp 50 remains essentially unchanged because the current source of the second differential input stage provides the current to the first differential input stage and the third differential stage.

Accordingly, a multiple differential input stage op amp has been provided in accordance with the invention described above. While the foregoing description has described several embodiments of the device, it is understood that the above description is illustrative only and not limiting of the disclosed invention. The DC gain and the unity gain bandwidth of the multiple differential input stage op amp are substantially increased with slight increases in power and wafer space requirements. As very large scale integration (VLSI) circuits are developed, the high speed and high gain op amp in accordance with this invention satisfies the increasing demand for high performance op amps. Furthermore, virtually unchanged power and wafer space requirements permit the multiple differential input stage op amp to be easily incorporated into current circuit designs implementing the single differential input stage op amp design with minor modifications to the circuit design. Although the embodiments of the op amp has been disclosed with reference to a differential output, variations of the op amp are applicable to op amp designs providing single ended outputs. It will be appreciated that modifications of the device in accordance with this invention are within the scope and spirit of this invention. Thus, the invention is to be limited only by the claims as set forth below.

What is claimed is:

1. A cascode operational amplifier comprising:

a differential input block which receives a differential input having a first differential input stage and a second differential input stage, the differential input block includes a first level shift circuit coupled between the first differential input stage and the second differential stage for shifting an input level to the second differential stage, a cascode block coupled to the differential input block which provides a differential output for the operational amplifier;

a common mode feedback block coupled to the second differential input stage of the differential input block and the differential output of the cascode block which stabilizes a direct current (DC) output level for the differential output; and a lead block coupled to the differential output of the cascode block which applies a resistive lead to the differential output in response to a differential input signal applied to the differential input block.

2. A cascode operational amplifier comprising:

a differential input block which receives a differential input having a first differential input stage and a second differential input stage;

a cascode block coupled to the differential input block which provides a differential output for the operational amplifier;

a common mode feedback block coupled to the second differential input stage of the differential input block and the differential output of the cascode block which stabilize a direct current (DC) output level for the differential output;

a load block coupled to the differential output of the cascode block which applies a resistive load to the differential output in response to a differential input signal applied to the differential input block; and the load block includes a third differential input stage coupled to the first differential input stage and the second differential input stage which receives the differential input.

3. A cascode operational amplifier comprising:

a differential input block which receives a differential input having a first differential input stage and a second differential input stage;

a cascode block coupled to the differential input block which provides a differential output for the operational amplifier;

a common mode feedback block coupled to the second differential input stage of the differential input block and the differential output of the cascode block which stabilizes a direct current (DC) output level for the differential output; and a load block coupled to the differential output of the cascode block which applies a resistive load to the differential output in response to a differential input signal applied to the differential input block, the load block includes a third differential input stage coupled to the first differential input stage and the second differential input stage which receives the differential input, the third differential input stage includes a third current source which regulates current through the third differential input stage.

4. The cascode operational amplifier of claim 3, wherein the third differential input stage includes a first level shift circuit coupled between the first differential input stage and the third differential input stage which shifts an input level to the third differential stage.

5. A multiple input stage cascode operational amplifier comprising:

a first differential input stage having a first amplifier input and a second amplifier input, a first differential stage first input coupled to a first input node and a first differential stage second input coupled to a second input node, and a first differential stage output;

a first differential input stage bias voltage circuit coupled to the first differential stage output and a lowest potential reference having a first bias voltage control input which controls input current through the first differential input stage in response to a first bias voltage control signal;

a second differential input stage having a third amplifier input coupled to the first amplifier input and a fourth amplifier input coupled to the second amplifier input, a second differential stage input, and a second differential stage first output coupled to the first input node and a second differential stage second output coupled to the second input node which provides input current to the first differential stage first input and the first differential stage second input in response to a differential input signal applied to the third amplifier input and the fourth amplifier input;

a second differential input stage bias voltage circuit having a second bias voltage circuit input, a second bias voltage circuit output coupled to the second differential stage input, and a second bias voltage control input which controls current through the second differential input stage in response to a second bias voltage control signal;

a common mode feedback block having a common mode input coupled to a power source, a common mode output coupled to the second bias voltage circuit input, and a first feedback input coupled to a first output node and a second feedback input coupled to a second output node which stabilizes an output level of the operational amplifier;

a cascode block having a first cascode input coupled to the first input node and a second cascode input coupled to the second input node, and a first cascode output coupled to the first output node and a second cascode output coupled to the second output node which provides output current to the first output node and the second output node; and a first load block having a first load input coupled to the first output node and a second load input coupled to the second output node, and a first load output and a second load output coupled to a lowest potential reference which provides a resistive load to the first output node and the second output node in response to the output current from the cascode block.

6. The operational amplifier of claim 5, further comprising a second load block coupled between the first load block and the lowest potential reference having a third load input coupled to the first load output of the first load block and a fourth load input coupled to the second load output of the first load block, a third load output coupled to the lowest potential reference, and a second load bias voltage control input and a third load bias voltage control input which provides a resistive load to the first output node and the second output node in response to the output current.

7. The operational amplifier of claim 5, further comprising a first level shift circuit coupled between the first amplifier input and the third amplifier input and a second level shift circuit coupled between the second amplifier input and the fourth amplifier input wherein the first level shift circuit and the second level shift circuit provide an input level shift of the differential input signal to the third amplifier input and the fourth amplifier input.

8. The operational amplifier of claim 5, wherein the first differential input stage includes a first n-channel device and a second n-channel device having a source of the first n-channel device coupled to a source of the second n-channel device to provide the first differential stage output, a drain of the first n-channel device receiving the first differential stage first input and a drain of the second n-channel device receiving the first differential stage second input, a gate of the first n-channel device receiving the first amplifier input and a gate of the second n-channel device receiving the second amplifier input.

9. The operational amplifier of claim 5, wherein the second differential input stage includes a first p-channel device and a second p-channel device having a source of the first p-channel device coupled to a source of the second p-channel device providing the second differential stage input, a drain of the first p-channel device providing the second differential stage first output and a drain of the second p-channel device providing the second differential stage second output, and a gate of the first p-channel device receiving the third amplifier input and a gate of the second p-channel device receiving the fourth amplifier input.

10. The operational amplifier of claim 5, wherein the common mode feedback block includes a first p-channel device and a second p-channel device having a source of the first p-channel device coupled to a source of the second p-channel device receiving the common mode input, a drain of the first p-channel device coupled to a drain of the second p-channel device providing the common mode output, and a gate of the first p-channel device receiving the first feedback input and a gate of the second p-channel device receiving the second feedback input.

11. The operational amplifier of claim, 5, wherein the cascode block includes a first p-channel device and a second p-channel device having a source of the first p-channel device receiving the first cascode input and the source of the second p-channel device receiving the second cascode input, a drain of the first p-channel device providing the first cascode output and a drain of the second p-channel device providing the second cascode output, and a gate of the first p-channel device coupled to a gate of the second p-channel device receiving a cascode bias voltage control input.

12. The operational amplifier of claim 5, wherein the first load block includes a first n-channel device and a second n-channel device having a drain of the first n-channel device receiving the first load input and the a drain of the second n-channel device receiving the second load input, a source of the first n-channel device providing the first load output and a source of the second n-channel device providing the second load output, and a gate of the first n-channel device coupled to a gate of the second n-channel device receiving a first load bias voltage control input.

13. A folded-cascode CMOS operational amplifier comprising:

a first differential input stage including a first n-channel device and a second n-channel device having a source of the first n-channel device coupled to a source of the second n-channel device to provide a first differential stage output, a drain of the first n-channel device to receive a first differential stage first input and a drain of the second n-channel device to receive a first differential stage second input, a gate of the first n-channel device to receive a first amplifier input and a gate of the second n-channel device to receive a second amplifier input;

a first differential input stage bias voltage circuit including a n-channel device having a drain coupled to the first differential stage output, a source coupled to a lowest potential reference, and a gate coupled to a first bias voltage control input which controls input current through the first differential input stage in response to a first bias voltage control signal;

a second differential input stage including a first p-channel device and a second p-channel device having a source of the first p-channel device coupled to a source of the second p-channel device to receive a second differential stage input, a drain of the first p-channel device coupled to the first differential stage first input and a drain of the second p-channel device coupled to the first differential stage second input, and a gate of the first p-channel device to receive the first amplifier input and a gate of the second p-channel device to receive the second amplifier input which provides the input current to the first differential stage first input and the first differential stage second input in response to a differential input signal;

a second differential input stage bias voltage circuit including a p-channel device having a drain coupled to the second differential stage input, a source coupled to a second bias voltage circuit input, and a gate coupled to a second bias voltage control input which controls output current through the second differential input stage in response to a second bias voltage control signal;

a common mode feedback block including a first p-channel device and a second p-channel device having a source of the first p-channel device and a source of the second p-channel device coupled to a power source, a drain of the first p-channel device and a drain of the second p-channel device coupled to the second bias voltage circuit input, and a gate of the first p-channel device coupled to a first operational amplifier output and a gate of the second p-channel device coupled to a second operational amplifier output;

a cascode block including a first p-channel device and a second p-channel device having a source of the first p-channel device coupled to the drain of the first p-channel device of the second differential input stage and a source of the second p-channel device coupled to the drain of the second p-channel device of the second differential input stage, a drain of the first p-channel device to provide the first operational amplifier output and a drain of the second p-channel device to provide the second operational amplifier output, and a gate of the first p-channel device coupled to a gate of the second p-channel device to receive a cascode bias voltage input so that the cascode block provides the first operational amplifier output and the second operational amplifier output in response to the output current from the second differential stage; and a load block including a first n-channel device and a second n-channel device having a drain of the first n-channel device coupled to the first operational amplifier output and a drain of the second n-channel device coupled to the second operational amplifier output, a source of the first n-channel device and a source of the second n-channel device coupled to a lowest potential reference, and a gate of the first n-channel device coupled to a gate of the second n-channel device to receive a load bias voltage control input so that the load block provides a resistive load in response to the output current from the first operational amplifier output and the second operational amplifier output.

14. The folded-cascode CMOS operational amplifier of claim 13, further comprising:

a first level shifter circuit coupled between the first amplifier input and the gate of the first p-channel device of the second differential input stage which shifts a first input signal of the differential input signal to the gate of the first p-channel device; and a second level shifter circuit coupled between the second amplifier input and the gate of the second p-channel device of the second differential input stage which shifts a second input signal of the differential input signal to the gate of the second p-channel device.

* * * * *